US012324226B2

(12) United States Patent
Sinha et al.

(10) Patent No.: US 12,324,226 B2
(45) Date of Patent: Jun. 3, 2025

(54) METHOD OF MANUFACTURING BIPOLAR COMPLEMENTARY-METAL-OXIDE-SEMICONDUCTOR (BiCMOS) DEVICES USING NICKEL SILICIDE

(71) Applicant: Newport Fab, LLC, Newport Beach, CA (US)

(72) Inventors: Mantavya Sinha, Irvine, CA (US); Edward Preisler, San Clemente, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 428 days.

(21) Appl. No.: 17/465,246

(22) Filed: Sep. 2, 2021

(65) Prior Publication Data

US 2022/0068914 A1 Mar. 3, 2022

Related U.S. Application Data

(62) Division of application No. 17/009,086, filed on Sep. 1, 2020, now Pat. No. 11,276,682.

(51) Int. Cl.
*H10D 84/40* (2025.01)
*H01L 21/324* (2006.01)
(Continued)

(52) U.S. Cl.
CPC ......... *H10D 84/401* (2025.01); *H01L 21/324* (2013.01); *H10D 10/40* (2025.01);
(Continued)

(58) Field of Classification Search
CPC ... H01L 29/456; H01L 29/459; H01L 29/665; H01L 29/6659; H01L 29/732;
(Continued)

(56) References Cited

U.S. PATENT DOCUMENTS 7,115,459 B2 * 10/2006 Bae ..................... H01L 21/8249
438/222
2002/0132438 A1 * 9/2002 Dunn ................. H01L 29/66242
257/E29.183
(Continued)

OTHER PUBLICATIONS

BA Webpage <https://www.semanticscholar.org/paper/SiGe%3AC-HBT-architecture-with-epitaxial-external-Fox-Heinemann/c62bdbf69c9e9d8fecd2b89cd18d3dc818e26c6d> showing figures from Fox, Alexander et al. "SiGe:C HBT architecture with epitaxial external base," 2011 IEEE Bipolar/BiCMOS Circuits and Technology Meeting, Atlanta, GA, USA, Oct. 9-11, 2011, pp. 70-73, available via purchase or subscription at webpage <https://ieeexplore.ieee.org/document/6082751>.

*Primary Examiner* — Timor Karimy
(74) *Attorney, Agent, or Firm* — Farjami & Farjami LLP

(57) ABSTRACT

A bipolar complementary-metal-oxide-semiconductor (BiCMOS) device includes a MOS transistor including CMOS nickel silicided regions in a CMOS region, and a bipolar transistor in a bipolar region. The bipolar transistor includes a nickel silicided emitter, a collector, and a base including an intrinsic base, a link base, and a nickel silicided extrinsic base. The intrinsic base is situated between the nickel silicided emitter and the collector. A dielectric spacer separates the link base from the nickel silicided emitter. The nickel silicided extrinsic base provides an electrical connection to the link base and the intrinsic base. A nickel silicided collector sinker provides an electrical connection to the collector. The CMOS nickel silicided regions, nickel silicided emitter, nickel silicided extrinsic base, and nickel silicided collector sinker can include an additive of molybdenum (Mo) and/or platinum (Pt). A low temperature rapid thermal anneal can be performed so as to prevent deactivation of dopants.

16 Claims, 7 Drawing Sheets

(51) Int. Cl.
*H10D 10/40* (2025.01)
*H10D 62/83* (2025.01)
*H10D 64/62* (2025.01)
*H10D 84/01* (2025.01)
*H10D 84/03* (2025.01)

(52) U.S. Cl.
CPC ............. *H10D 62/83* (2025.01); *H10D 64/62* (2025.01); *H10D 84/0109* (2025.01); *H10D 84/038* (2025.01)

(58) Field of Classification Search
CPC ........... H01L 29/7833; H01L 21/28518; H01L 21/324; H01L 21/8249; H01L 27/0623
See application file for complete search history.

(56) References Cited

U.S. PATENT DOCUMENTS

2004/0123922 A1* 7/2004 Cabral, Jr. ........ C04B 35/58085
257/E21.165
2012/0126297 A1* 5/2012 Yamaguchi ......... H01L 21/6875
257/E21.409
2019/0109055 A1* 4/2019 Preisler ............... H01L 29/0692

\* cited by examiner

METHOD OF MANUFACTURING BIPOLAR COMPLEMENTARY-METAL-OXIDE-SEMICONDUCTOR (BiCMOS) DEVICES USING NICKEL SILICIDE

This is a divisional of and claims the benefit of and priority to parent application Ser. No. 17/009,086 filed on Sep. 1, 2020. The content of the above-identified parent application is hereby incorporated fully by reference into the present divisional application.

BACKGROUND

Bipolar transistors, such as heterojunction bipolar transistors HBTs), are commonly employed in radio frequency (RF) circuits where high speeds and high gains are required. HBTs are also commonly integrated with complementary-metal-oxide-semiconductor (CMOS) transistors in bipolar CMOS (BiCMOS) devices in order to efficiently implement control/logic circuits.

A silicidation process designed for CMOS transistors may be unsuitable for integrated bipolar transistors and specifically for integrated HBTs. In order to meet speed and gain requirements, HBTs rely on particularized dopant profiles, thin intrinsic and extrinsic base regions, and low contact resistances. Forming conventional CMOS silicides, such as cobalt silicides, in a BiCMOS device including HBTs can negatively impact the dopant profiles of the HBT. Forming such silicides can also risk unintentional spikes through thin extrinsic base regions and cause electrical shorts. Overcoming these consequences often requires increasing the thickness of the intrinsic and extrinsic bases in a manner that sacrifices speed and gain, and/or increasing other device dimensions in a manner that increases contact resistances and die area.

Thus, there is a need in the art for silicified BiCMOS devices that have improved control over dopant profile and decreased device dimensions without sacrificing performance parameters.

SUMMARY

The present disclosure is directed to nickel silicide in bipolar complementary-metal-oxide-semiconductor (BiCMOS) device and method of manufacturing, substantially as shown in and/or described in connection with at least one of the figures, and as set forth in the claims.

DETAILED DESCRIPTION

Figure 1:
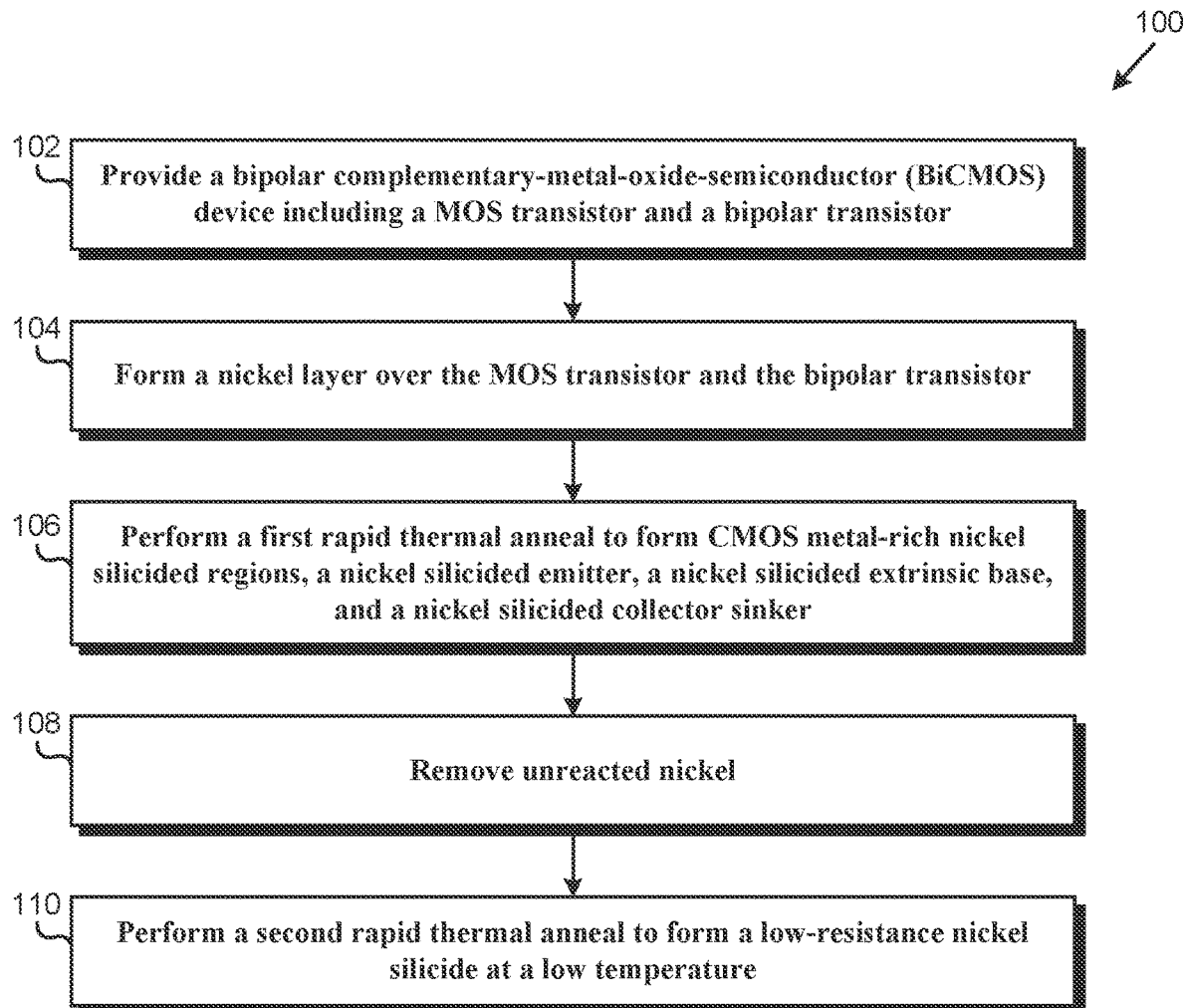
FIG. 1 illustrates a flowchart of an exemplary method for manufacturing a bipolar complementary-metal-oxide-semiconductor (BiCMOS) device according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
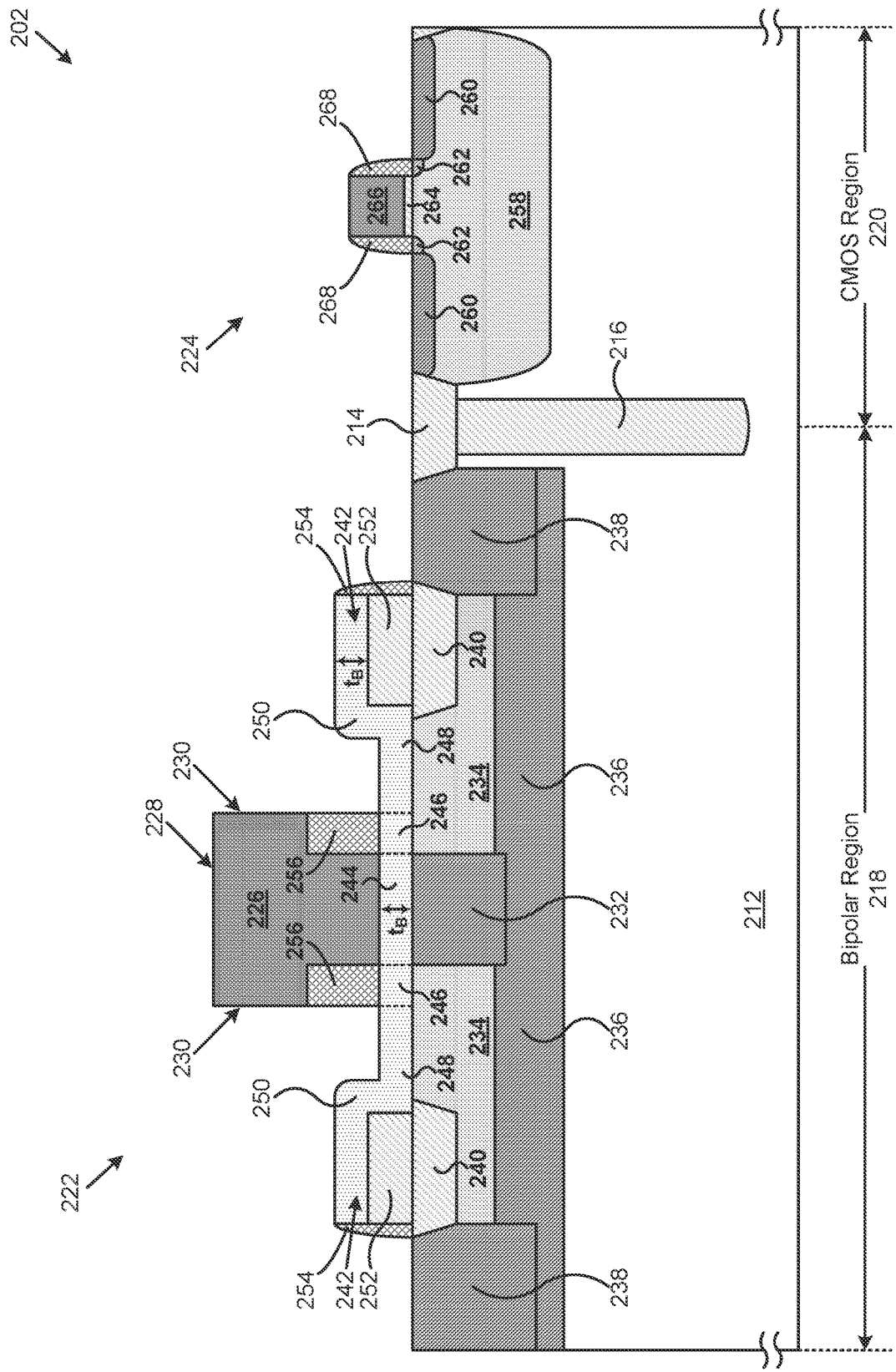
FIG. 2 illustrates a BiCMOS structure processed in accordance with the flowchart of FIG. 1 according to one implementation of the present application.
Figure 3:
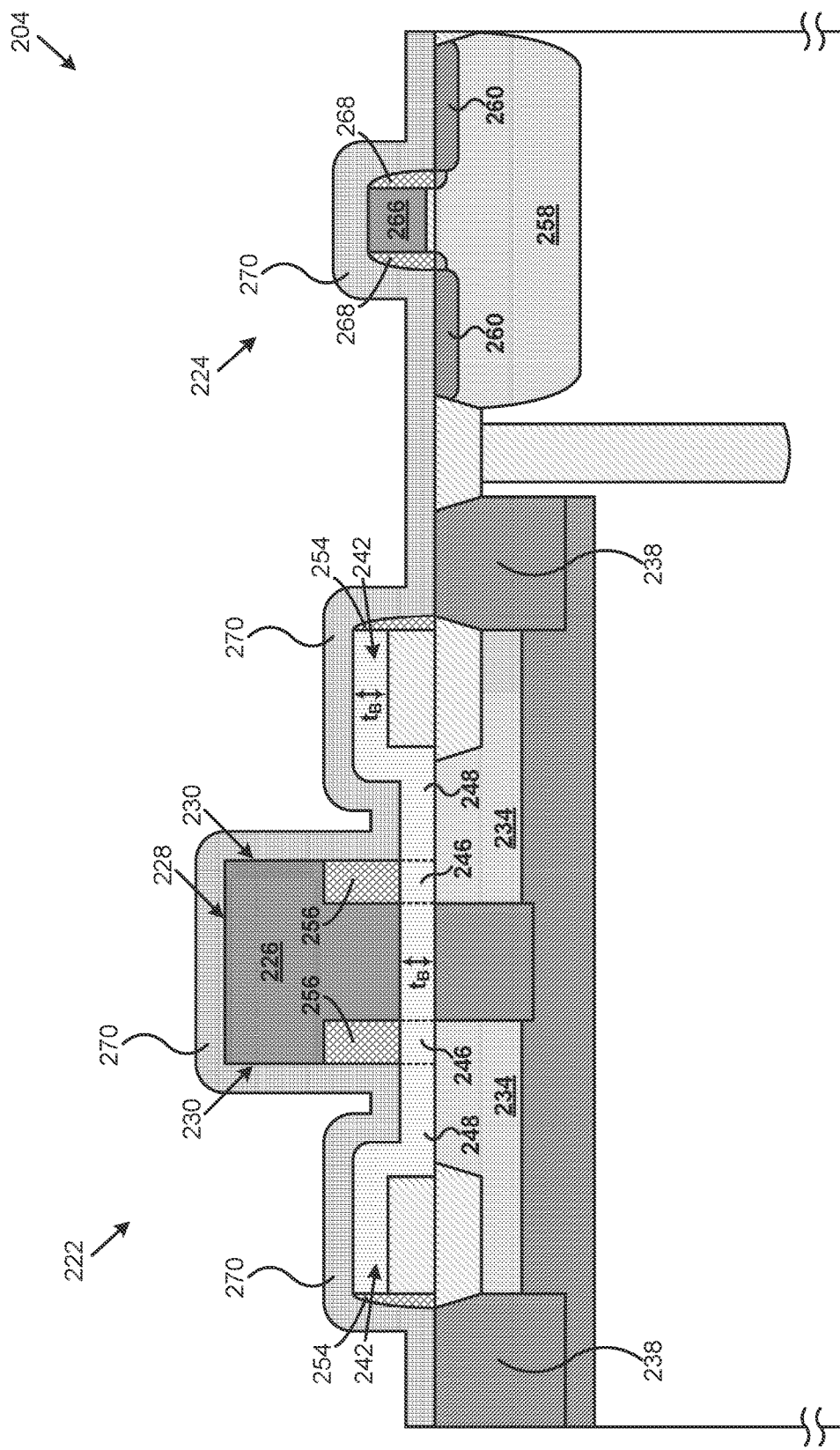
FIG. 3 illustrates a BiCMOS structure processed in accordance with the flowchart of FIG. 1 according to one implementation of the present application.

FIG. 1 illustrates a flowchart of an exemplary method for manufacturing a bipolar complementary-metal-oxide-semiconductor (BiCMOS) device according to one implementation of the present application. Structures shown in FIGS. 2 through 6 illustrate the results of performing actions 102 through 110 shown in flowchart 100 of FIG. 1. For example, FIG. 2 shows a BiCMOS structure after performing action 102 in FIG. 1, FIG. 3 shows a BiCMOS structure after performing action 104 in FIG. 1, and so forth.

Actions 102 through 110 shown in flowchart 100 of FIG. 1 are sufficient to describe one implementation of the present inventive concepts. Other implementations of the present inventive concepts may utilize actions different from those shown in the flowchart of FIG. 1. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 2 illustrates a BiCMOS structure processed in accordance with action 102 in the flowchart of FIG. 1 according to one implementation of the present application. As shown in FIG. 2, a BiCMOS structure 202 is provided. BiCMOS structure 202 includes substrate 212 having isolation structures 214 and 216 therein that divide BiCMOS structure 202 into bipolar region 218 and CMOS region 220.

In various implementations substrate 212 can comprise bulk silicon (for example, high-resistivity silicon), germanium, or a group III-V material. For example, substrate 212 can be a typical monocrystalline bulk silicon. In other implementations, substrate 212 can be a pre-fabricated semiconductor-on-insulator (SOI) substrate. In the SOI implementation, a bonded and etch back SOT (BESOI) process, a separation by implantation of oxygen (SIMOX) process, or a "smart cut" process can be used for fabricating the SOI substrate as known in the art.

Bipolar transistor 222 is situated in bipolar region 218. MOS transistor 224 is situated in CMOS region 220. Additional bipolar devices and additional CMOS devices (not shown in FIG. 2) can be situated in bipolar region 218 and CMOS region 220 respectively.

MOS transistor 224 includes transistor body 258, source/drain regions 260, lightly-doped source/drain regions 262, gate oxide 264, gate 266, and dielectric spacers 268. Transistor body 258 is situated in substrate 212. Transistor body 258 has a first conductivity type. For example, transistor body 258 can be implanted with boron or another appropriate P type dopant, such that transistor body 258 has P type conductivity.

Source/drain regions 260 are situated in transistor body 258. Lightly-doped source/drain regions 262 are also situated in transistor body 258. Source/drain regions 260, as well as lightly-doped source/drain regions 262, have a second conductivity type opposite to the first conductivity type. Continuing the above example, where transistor body 258 has P type conductivity, source/drain regions 260, as well as lightly-doped source/drain regions 262, can be implanted with phosphorus or another appropriate N type dopant. As known in the art, lightly-doped source/drain regions 262 can be regions having lower dopant concentration than source/drain regions 260. Source/drain regions 260 and lightly-doped source/drain regions 262 together function as sources/drains of MOS transistor 224.

Gate oxide 264 is situated over transistor body 258. Gate oxide 264 can comprise, for example, silicon dioxide ($SiO_2$) or another dielectric. Gate 266 is situated over gate oxide 264. Gate 266 can comprise polycrystalline silicon (polysilicon) or a conductive metal. Dielectric spacers 268 are situated on sides of gate 266. Dielectric spacers 268 can comprise, for example, silicon nitride (SiN). In the present implementation, lightly-doped source/drain regions 262 are aligned with gate 266, while source/drain regions 260 are aligned with dielectric spacers 268.

Bipolar transistor 222 includes emitter 226, base 242, intrinsic collector 232 and extrinsic collector 234, isolation structures 240, dielectric segments 252, and dielectric spacers 254 and 256. Emitter 226 is situated over base 242. Emitter 226 can comprise polysilicon. In one implementation, where bipolar transistor 222 is an NPN transistor, emitter 226 can be implanted with phosphorus or another appropriate N type dopant.

Emitter 226 includes top surface 228 and sidewalls 230. On an upper part of emitter 226, sidewalls 230 are exposed. On a lower part of emitter 226, sidewalls 230 are surrounded by dielectric spacers 256. In the present implementation, emitter 226 is substantially "T" shaped. In various implementations, emitter 226 may have any other shape. Dielectric spacers 256 separate link bases 246 from emitter 226. Dielectric spacers 256 on sidewalls 230 of emitter 226 can comprise, for example, $SiO_2$, SiN, or a bilayer of $SiO_2$ and SiN.

Intrinsic collector 232 and extrinsic collector 234 are situated in bipolar region 218. Intrinsic collector 232 and extrinsic collector 234 have the same conductivity type as emitter 226. Intrinsic collector 232 is relatively heavily doped compared to extrinsic collector 234. Continuing the above example, where bipolar transistor 222 is an NPN transistor, extrinsic collector 234 can be implanted with an N type dopant, while intrinsic collector 232 can be heavily implanted with an N+ type dopant.

Sub-collector 236 is situated in substrate 212 below intrinsic collector 232, extrinsic collector 234, and collector sinkers 238. Sub-collector 236 and collector sinkers 238 can be heavily doped regions having the same conductivity type as intrinsic collector 232. Continuing the above example, where bipolar transistor 222 is an NPN transistor, sub-collector 236 and collector sinkers 238 can be heavily implanted with an N+ type dopant. Sub-collector 236 and collector sinkers 238 provide a low resistance electrical pathway from intrinsic collector 232 through sub-collector 236 and collector sinkers 238 to the top surface of substrate 212. Thus, collector sinkers 238 provide external electrical connections to the collector of bipolar transistor 222.

Isolation structures 240 are situated in extrinsic collector 234 near collector sinkers 238. Isolation structures 240 can be, for example, local oxidation of silicon ("LOCOS") or shallow trench isolation ("STI") oxide, formed in a manner known in the art, Dielectric segments 252 are situated on isolation structures 240. The presence of dielectric segments 252 on isolation structures 240 increases the separation between extrinsic bases 248 of base 242 and extrinsic collector 234. The increased separation translates to a lower capacitance value between extrinsic bases 248 and extrinsic collector 234. In one implementation, dielectric segments 252 can comprise $SiO_2$. In various implementations, dielectric segments 252 can be low-k dielectric materials having a dielectric constant lower than $SiO_2$, such as porous silica, fluorinated amorphous carbon, fluoro-polymer, parylene, polyarylene ether, silsesquioxane, fluorinated silicon dioxide, and diamond-like carbon.

Base 242 is situated on intrinsic collector 232, extrinsic collector 234, and dielectric segments 252. Base 242 includes intrinsic base 244, link bases 246, and extrinsic bases 248. Intrinsic base 244 is situated between emitter 226 and intrinsic collector 232. Intrinsic base 244 refers to the region of base 242 underlying the bottom surface of emitter 226, enclosed within dashed lines in FIG. 2. In the present implementation, the bottom of emitter 226 is aligned with intrinsic collector 232. Link bases 246 are situated between intrinsic base 244 and extrinsic bases 248. Link bases 246 refer to the regions of base 242 underlying dielectric spacers 256, as indicated by dashed lines in FIG. 2. Dielectric spacers 256 separate link bases 246 from emitter 226. Extrinsic bases 248 are connected to link bases 246. Extrinsic bases 248 are situated over extrinsic collector 234 and dielectric segments 252. Intrinsic base 244 is the part of base 242 functioning to cause a current flow from emitter 226 to intrinsic collector 232 of bipolar transistor 222, while extrinsic bases 248 provide external electrical connections to link bases 246 and intrinsic base 244.

In the present implementation, bipolar transistor 222 is a heterojunction bipolar transistor (HBT). Base 242 can comprise a different material than emitter 226 and/or intrinsic collector 232, thereby creating a heterojunction with emitter 226 and/or intrinsic collector 232. This heterojunction enables bandgap narrowing and makes it possible for bipolar transistor 222 to achieve high gain values. In one implementation, emitter 226 and intrinsic collector 232 comprise silicon, and base 242 comprises silicon-germanium (SiGe).

In the present implementation, base 242 is heavily doped and has a conductivity type opposite to the conductivity type of emitter 226 and intrinsic collector 232. Continuing the above example, where bipolar transistor 222 is an NPN transistor, base 242 can be heavily implanted with a P+ type dopant. Heavy doping of base 242 further enables bandgap narrowing and makes it possible for bipolar transistor 222 to achieve higher gain values.

In the present implementation, base 242 can also be a thin base. Thickness $t_B$ of base 242 can have the minimum possible value permitted for a given fabrication process. Base 242 can be formed by chemical vapor deposition (CVD), physical vapor deposition (PVD), or molecular beam epitaxy (MBE), and can have a minimum possible thickness permitted by the formation technique. In one implementation, the thickness $t_B$ of base 242 can be on the order of one hundred angstroms (100 Å) or less. Thin base 242 causes an increased gain for bipolar transistor 222, and additionally enables low intrinsic device delays essential for high speed circuit performance.

Base 242 is conformally formed. In particular, extrinsic bases 248 conform to dielectric segments 252. As such, segments of extrinsic bases 248 over extrinsic collector 234 are situated at a lower height than segments of extrinsic bases 248 over dielectric segments 252. Conformal segments 250 of extrinsic bases 248 transition from the height of extrinsic bases 248 over extrinsic collector 234 to the height extrinsic bases 248 over dielectric segments 252. Notably, there exist gaps in extrinsic bases 248 between conformal segments 250 of extrinsic bases 248 and dielectric spacers 256.

Dielectric spacers 254 are situated on sides of extrinsic bases 248 and sides of dielectric segments 252. Dielectric spacers 254 can comprise, for example, SiN. Dielectric spacers 254 separate extrinsic bases 248 from collector sinkers 238. As described above, dielectric segments 252 lower the capacitance value between extrinsic bases 248 and extrinsic collector 234.

FIG. 3 illustrates a BiCMOS structure processed in accordance with action 104 in the flowchart of FIG. 1 according to one implementation of the present application. As shown in FIG. 3, in BiCMOS structure 204, nickel layer 270 is formed over MOS transistor 224 and bipolar transistor 222. On MOS transistor 224, nickel layer 270 is situated on source/drain regions 260, gate 266, and dielectric spacers 268. On bipolar transistor 222, nickel layer 270 is situated on collector sinkers 238, extrinsic bases 248, top surface 228 of emitter 226, sidewalls 230 of emitter 226, dielectric spacers 254, and dielectric spacers 256.

Nickel layer 270 can be formed, for example, by sputtering. In one implementation, layer 270 comprises only nickel (Ni). In various implementations, nickel layer 270 comprises nickel along with one or more additives of molybdenum (Mo) and/or platinum (Pt). If nickel layer 270 is too thick, it can consume the entire semiconductor thickness $t_B$ of extrinsic bases 248 during a subsequent annealing action, and undesirably short extrinsic base 248 of base 242 to extrinsic collector 234. In one implementation, in order to maintain extrinsic bases 248 as thin extrinsic bases while still preventing shorting, the thickness of nickel layer 270 can have the minimum permitted thickness needed to achieve a complete layer for a given fabrication process. If both nickel layer 270 and base 242 having the minimum permitted thicknesses would still result in shorting, thickness $t_B$ of base 242 can be increased as needed to prevent shorting.

Figure 4:
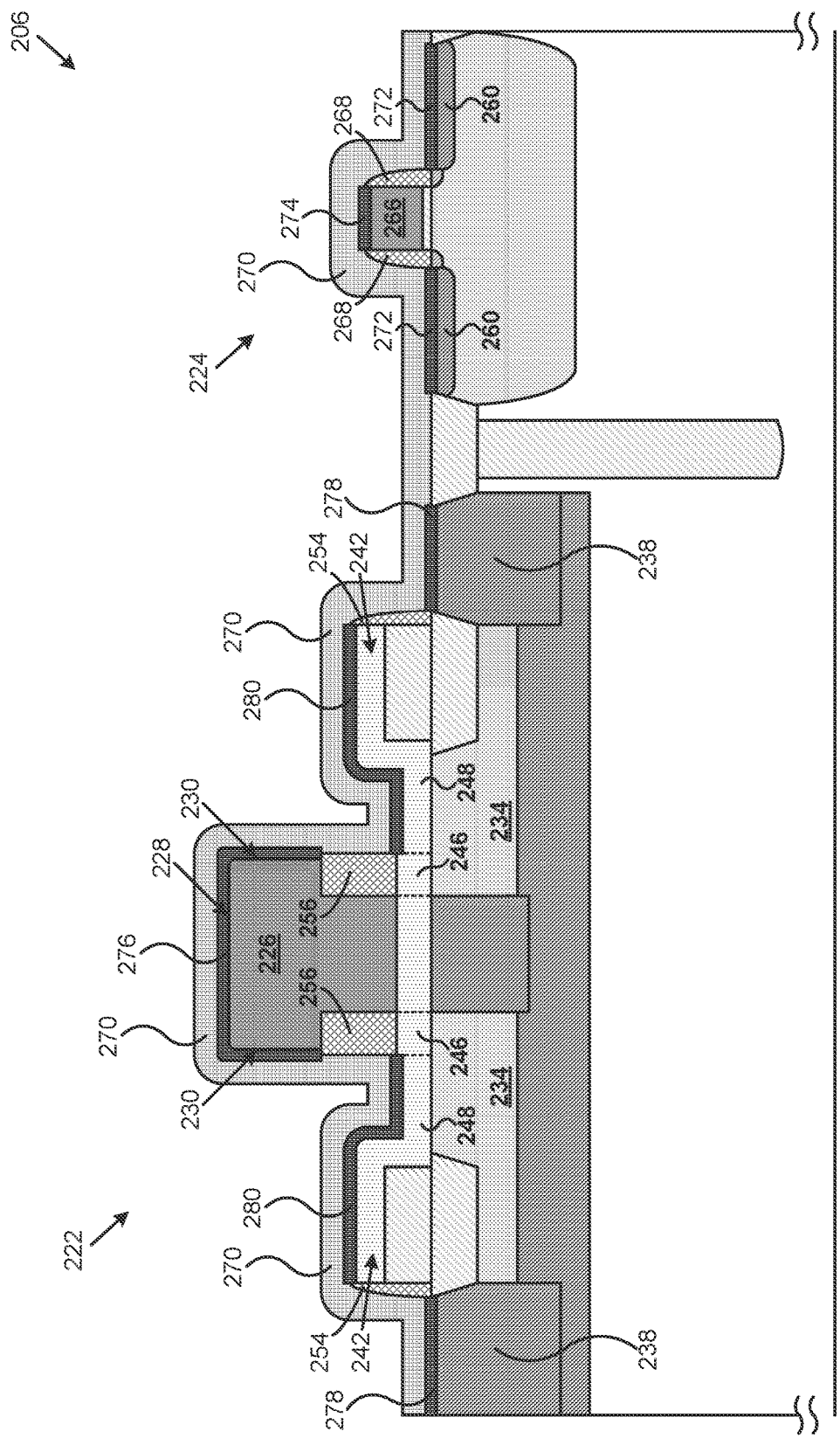
FIG. 4 illustrates a BiCMOS structure processed in accordance with the flowchart of FIG. 1 according to one implementation of the present application.

FIG. 4 illustrates a BiCMOS structure processed in accordance with action 106 in the flowchart of FIG. 1 according to one implementation of the present application. As shown in FIG. 4, in BiCMOS structure 206, a first rapid thermal anneal (RTA) is performed. The first RTA can be performed at a temperature in the range of approximately two hundred and fifty degrees Celsius (250° C.) to approximately three hundred and fifty degrees Celsius (350° C.). The first RTA causes nickel layer 270 to react with source/drain regions 260 and gate 266 on MOS transistor 270 to form metal-rich nickel silicides 272 and 274 respectively. In the present application, nickel silicides 272 and corresponding source/drain regions 260, as well as nickel silicide 274 and corresponding gate 266, may be collectively referred to as "CMOS nickel silicided regions." It is noted that dielectric spacers 268 do not react during the first RTA and are thus not silicided. As such, dielectric spacers 268 are utilized to separate and insulate nickel silicides 272 and 274 from shorting to each other.

The first RTA also causes nickel layer 270 to react with emitter 226, collector sinkers 238, and extrinsic bases 248 on bipolar transistor 222 to form metal-rich nickel silicides 276, 278, and 280 respectively. Notably, nickel silicide 276 is situated on top surface 228 and on sidewalls 230 of emitter 226. In the present application, nickel silicide 276 and emitter 226 may be collectively referred to as a "nickel silicided emitter." Similarly, nickel silicides 278 and collector sinkers 238 may be collectively referred to as "nickel silicided collector sinkers," and silicides 280 and extrinsic bases 248 may be collectively referred to as "nickel silicided extrinsic bases." It is noted that dielectric spacers 254 and 256 do not react during the first RTA and are thus not silicided. As such, dielectric spacers 254 are utilized to separate and insulate nickel silicides 278 and 280 from shorting to each other, and dielectric spacers 256 are utilized to separate and insulate nickel silicides 276 and 280 from shorting to each other.

Only small volumes of silicon of extrinsic bases 248 are consumed during formation of nickel silicides 280. For example, nickel layer 270 may consume approximate fifty (percent (50%) less silicon of extrinsic bases 248 during formation of nickel silicides 280, compared to a volume of silicon of extrinsic bases 248 consumed by a conventional cobalt layer during formation of conventional cobalt silicides. Because nickel layer 270 utilizes small volumes of silicon of extrinsic bases 248, nickel silicides 280 are thin and do not undesirably short to extrinsic collector 234. Additionally, intrinsic base 244, link bases 246, and extrinsic bases 248 can be formed thin. Furthermore, thin intrinsic base 244 results in an increased gain for bipolar transistor 222.

Because nickel layer 270 utilizes small volumes of silicon of extrinsic bases 248, nickel suicides 280 do not extend significantly into link bases 246 under dielectric spacers 256. As seen in FIG. 4, nickel silicides 280 are approximately aligned with dielectric spacers 256 at the edge of link bases 246. Thus, nickel silicides 280 offer better control over device design, and do not risk shorting to emitter 226. Moreover, nickel silicides 280 are thin and do not undesirably short to extrinsic collector 234 and do not interfere with the collector. Notably, small volumes of silicon of source/drain regions 260, gate 266, emitter 226, and collector sinkers 238 are also utilized during formation of nickel silicides 272, 274, 276, and 278 respectively.

As described above, in various implementations, nickel layer 270 comprises nickel along with one or more additives of Mo and/or Pt. In such implementations, nickel silicides 272, 274, 276, 278, and 280 will include these additives. These additives further prevent spiking and/or agglomeration in nickel silicides 272, 274, 276, 278, and 280.

Figure 5:
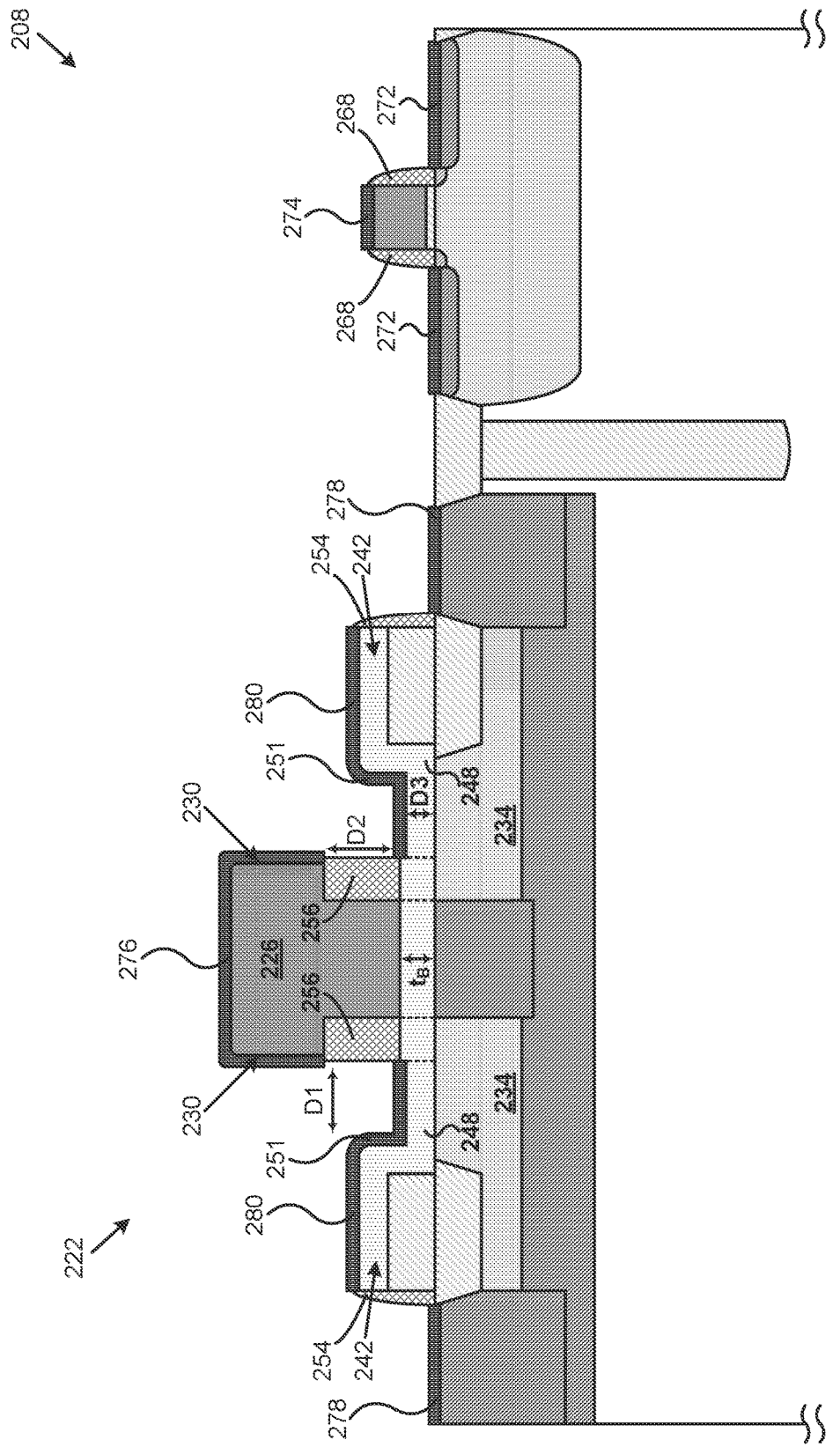
FIG. 5 illustrates a BiCMOS structure processed in accordance with the flowchart of FIG. 1 according to one implementation of the present application.

FIG. 5 illustrates a BiCMOS structure processed in accordance with action 108 in the flowchart of FIG. 1 according to one implementation of the present application. As shown in FIG. 5, in BiCMOS structure 208, unreacted nickel is removed. Dielectric spacers 254, 256, and 268 do not react during the first RTA and are thus not silicided. As such, unreacted nickel from nickel layer 270 (shown in FIG. 4) is removed from dielectric spacers 254, 256, and 268. Unreacted nickel from nickel layer 270 (shown in FIG. 4) is also removed from nickel silicides 272, 274, 276, 278, and 280.

Unreacted nickel can be removed, for example, using a wet etch sulfuric peroxide mix comprising sulfuric acid and hydrogen peroxide. In various implementations, other etch chemistries or other techniques may be utilized to remove unreacted nickel. In various implementations, unreacted additives of Mo and/or Pt may be removed concurrently with the removal of unreacted nickel, or using another cleaning action.

Remaining nickel silicides 272, 274, 276, 278, and 280 enable BiCMOS structure 208 to achieve reduced dimensions. As described above, because nickel layer 270 (shown in FIG. 4) utilizes small volumes of silicon of extrinsic bases 248, nickel silicides 280 are thin. The spacing between conformal segments 251 of the nickel silicided extrinsic bases and dielectric spacers 256, represented by dimension D1 in FIG. 5, can be reduced without nickel silicides 280 shorting to nickel silicide 276 on sidewalls 230 of emitter 226. In contrast, utilizing thicker conventional cobalt silicides would require increasing dimension D1 in order to avoid shorting. Increasing dimension D1 not only occupies more die area, but also undesirably increases a base resistance of bipolar transistor 222. In one implementation, conformal segments 251 of the nickel silicided extrinsic bases are situated at a minimum process dimension from dielectric spacers 256 (i.e., dimension D1 is a minimum process dimension), so as to reduce the base resistance of bipolar transistor 222. Decreasing dimension D1 also preserves die area, making BiCMOS structure 208 better suited for large-scale fabrication.

Because nickel silicides 280 are thin, the spacing between lower segments of nickel silicides 280 overlying extrinsic collector 234 and nickel silicide 276 on sidewalls 230 of emitter 226, represented by dimension D2 in FIG. 5, can be reduced without nickel silicides 280 shorting to nickel silicide 276. In turn, the height of dielectric spacers 256 and the height of emitter 226 can be reduced, potentially reducing stresses and strains as well as emitter resistance, and allowing for a smaller form factor. Additionally, the spacing between the lower segments of nickel silicides 280 and extrinsic collector 234, represented by dimension D3 in FIG. 5, and correspondingly the thickness $t_B$ of base 242, can be reduced. Reduced dimension D3 and reduced thickness $t_B$ can advantageously cause an increased gain of bipolar transistor 222.

Figure 6:
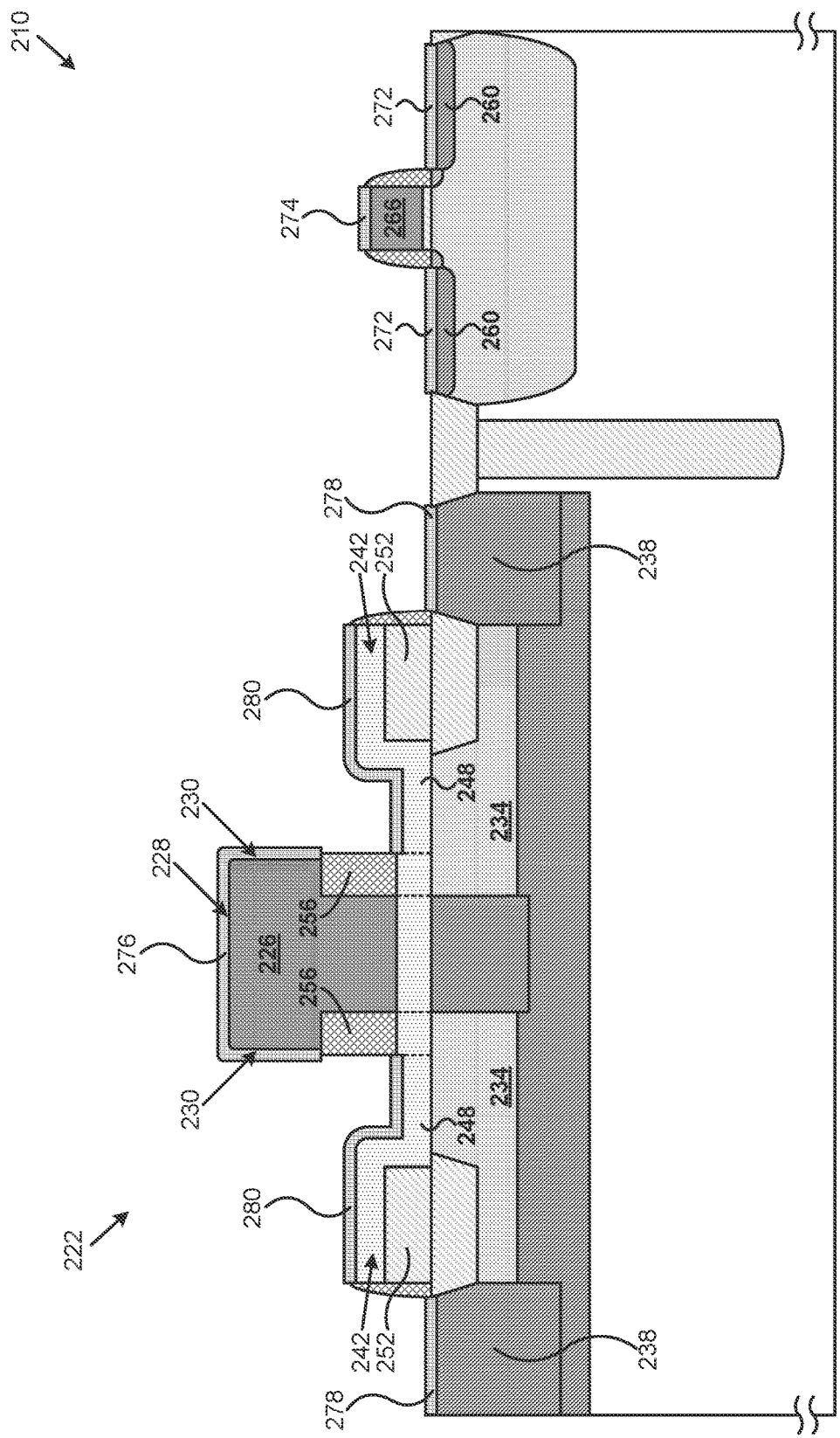
FIG. 6 illustrates a BiCMOS structure processed in accordance with action the flowchart of FIG. 1 according to one implementation of the present application.

FIG. 6 illustrates a BiCMOS structure processed in accordance with action 110 in the flowchart of FIG. 1 according to one implementation of the present application. As shown in FIG. 6, in BiCMOS structure 210, a second RTA is performed at a low temperature. As used herein, a low-temperature RTA refers to the temperature of the RTA being lower than a temperature which would deactivate dopants in BiCMOS structure 210. For example, dopants in BiCMOS structure 210 may be deactivated at approximately six hundred degrees Celsius (600° C.) or higher. For conventional cobalt silicide, the temperature of a second RTA needed to transform cobalt silicide into a less cobalt-rich form may be approximately six hundred and fifty degrees Celsius (650° C.). At such temperatures, the RTA would deactivate dopants in BiCMOS structure 210, preventing bipolar transistor 222 from achieving high gain values.

In contrast, nickel silicides 272, 274, 276, 278, and 280 transform into less nickel-rich forms at a lower temperature. For example, in FIG. 6, the second RTA can be performed at a temperature of approximately four hundred and fifty degrees Celsius (450° C.). Thus, the second RTA is a low temperature RTA, and would prevent deactivation of dopants in BiCMOS structure 210. Maintaining active dopants in heavily doped base 242 enables bandgap narrowing, which is especially significant for HBT designs since bandgap narrowing can cause increased gain values.

The second RTA transforms nickel-rich nickel silicides into less nickel-rich forms having high conductivity and low electromigration. Nickel silicides 272, 274, 276, 278, and 280 create highly conductive electrical connections to source/drain regions 260, gate 266, emitter 226, collector sinkers 238, and extrinsic bases 248. In particular, nickel silicides 276, 278, and 280 reduce the emitter contact resistance, collector contact resistance, and base contact resistance of bipolar transistor 222, enabling improved current gain.

Nickel silicide 276 particularly reduces the emitter contact resistance of bipolar transistor 222. For example, if a subsequently formed emitter contact (not shown) were misaligned, because nickel silicide 276 extends to and is situated on sidewalls 230 of emitter 226, portions of the emitter contact that would otherwise contact low conductivity dielectric spacers 256 may instead contact high conductivity nickel silicide 276. As another example, because nickel silicide 276 wraps around top surface 228 to sidewalls 230, nickel silicide 276 reduces abnormalities and current crowding at corners of the nickel silicided emitter.

BiCMOS structure 210 represents a substantially completed BiCMOS device. However, BiCMOS structure 210 can also include additional elements not shown in FIG. 6. For example, a multi-layer stack of metallizations and interlayer dielectrics can be situated over BiCMOS structure 2110 to create connections to nickel silicides 272, 274, 276, 278, and 280. As another example, passive devices, such as inductors and capacitors, can be integrated in an overlying multi-layer stack.

Figure 7:
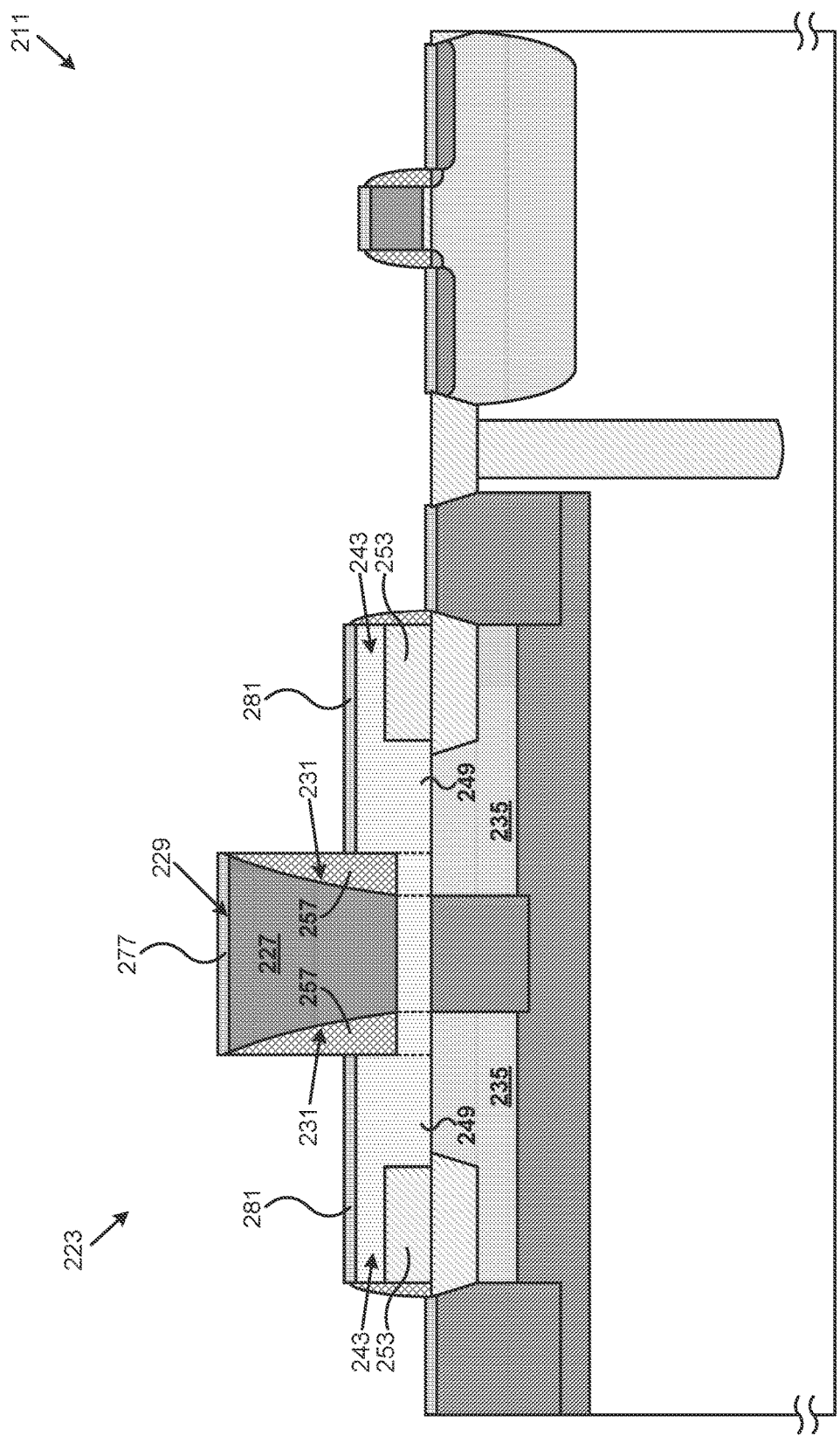
FIG. 7 illustrates a BiCMOS structure processed according to one implementation of the present application.

FIG. 7 illustrates a BiCMOS structure processed according to one implementation of the present application. BiCMOS structure 211 in FIG. 7 represents an alternative implementation to BiCMOS structure 210 in FIG. 6. Except for differences noted below, bipolar transistor 223, emitter 227, top surface 229, sidewalls 231, extrinsic collector 235, extrinsic bases 249, dielectric segments 253, dielectric spacers 257, and nickel silicides 277 and 281 in FIG. 7 generally correspond to bipolar transistor 222, emitter 226, top surface 228, sidewalk 230, extrinsic collector 234, extrinsic bases 248, dielectric segments 252, dielectric spacers 256, and nickel silicides 276 and 280 in FIG. 6.

As shown in FIG. 7, in bipolar transistor 223, extrinsic bases 249 are raised. Referring back to FIG. 6, extrinsic bases 248 are conformal, have uniform thickness, have lower segments with a first height over extrinsic collector 234, and have upper segments with a second height over dielectric segments 252. In contrast, in FIG. 7, extrinsic bases 249 are raised. In one exemplary implementation, extrinsic bases 249 have a first thickness over extrinsic collector 235, and a second thickness over dielectric segments 253. In that exemplary implementation, extrinsic bases 249 may have a substantially planar top surface, and nickel silicides 281 on extrinsic bases 249 may also be substantially planar. Referring back to FIG. 6, nickel silicide 276 is situated on top surface 228 as well as on sidewalls 230 of emitter 226. In contrast, in FIG. 7, nickel silicide 277 is situated only on top surface 229 of emitter 227. Dielectric spacers 257 surround sidewalls 231 of emitter 227. Extrinsic bases 249 are situated against the sides of dielectric spacers 257. BiCMOS structure 211 may reduce the base contact resistance of bipolar transistor 223 by providing increased contact area for the nickel silicified extrinsic base, without increasing the thickness of the intrinsic base.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method comprising:
providing a bipolar complementary-metal-oxide-semiconductor (BiCMOS) device comprising:
a MOS transistor in a CMOS region;
a bipolar transistor in a bipolar region, said bipolar transistor comprising:
an emitter, a collector comprising an intrinsic collector, an extrinsic collector, and collector sinker, and a base comprising an intrinsic base, a link base, and an extrinsic base;
said intrinsic base being situated between said emitter and said intrinsic collector;
a dielectric spacer separating said link base from said emitter;
said extrinsic base providing an electrical connection to said link base and said intrinsic base;
said extrinsic base situated on said extrinsic collector and on a dielectric segment, said extrinsic base having a first thickness over a first segment of said bipolar region, said first thickness extending from said extrinsic collector to a substantially planar top surface of said extrinsic base, and said extrinsic base having a second thickness different from said first thickness over a second segment of said bipolar region, said second thickness extending from said dielectric segment to said substantially planar top surface of said extrinsic base;
said collector sinker providing an electrical connection to said intrinsic collector;
and
forming a nickel layer over said MOS transistor and said bipolar transistor, including on said substantially planar top surface of said extrinsic base in both said first segment and said second segment of said bipolar region.

2. The method of claim 1 further comprising performing a first rapid thermal anneal, wherein said performing said first rapid thermal anneal forms CMOS nickel silicided regions, a nickel silicided extrinsic base, and a nickel silicided collector sinker.

3. The method of claim 2 further comprising performing a second rapid thermal anneal.

4. The method of claim 2, further comprising removing unreacted nickel of said nickel layer.

5. The method of claim 1, wherein said extrinsic base is raised.

6. A method comprising:
providing a bipolar complementary-metal-oxide-semiconductor (BiCMOS) device comprising:
a MOS transistor in a CMOS region;
a bipolar transistor in a bipolar region, said bipolar transistor comprising:
an emitter, a collector comprising an intrinsic collector, an extrinsic collector, and collector sinker, and a base comprising an intrinsic base, a link base, and an extrinsic base;
said intrinsic base being situated between said emitter and said intrinsic collector;
a dielectric spacer separating said link base from said emitter;
said extrinsic base providing an electrical connection to said link base and said intrinsic base;
said extrinsic base situated on said extrinsic collector and on a dielectric segment, said extrinsic base having a first thickness over a first segment of said bipolar region, said first thickness extending from said extrinsic collector to a substantially planar top surface of said extrinsic base, and said extrinsic base having a second thickness different from said first thickness over a second segment of said bipolar region, said second thickness extending from said dielectric segment to said substantially planar top surface of said extrinsic base;
said collector sinker providing an electrical connection to said intrinsic collector;
and
forming a nickel layer over said MOS transistor and said bipolar transistor, including on said substantially planar top surface of said extrinsic base in both said first segment and said second segment of said bipolar region, said nickel layer including molybdenum (Mo) additive.

7. The method of claim 6 further comprising performing a first rapid thermal anneal to form nickel silicided regions.

8. The method of claim 7 further comprising removing unreacted nickel of said nickel layer.

9. The method of claim 8 further comprising removing unreacted Mo additive concurrently with said removing said unreacted nickel.

10. The method of claim 7, wherein said nickel silicided regions comprise a nickel silicided extrinsic base, a nickel silicided emitter, and a nickel silicided collector sinker.

11. The method of claim 7 further comprising performing a second rapid thermal anneal.

12. The method of claim 6, wherein said extrinsic base is raised.

13. A method comprising:
providing a bipolar complementary-metal-oxide-semiconductor (BiCMOS) device comprising:
a MOS transistor in a CMOS region;
a bipolar transistor in a bipolar region, said bipolar transistor comprising:
an emitter, a collector comprising an intrinsic collector, an extrinsic collector, and collector sinker, and a base comprising an intrinsic base, a link base, and an extrinsic base;
said intrinsic base being situated between said emitter and said intrinsic collector;
a dielectric spacer separating said link base from said emitter;
said extrinsic base providing an electrical connection to said link base and said intrinsic base;
said extrinsic base situated on said extrinsic collector and on a dielectric segment, said extrinsic base having a first thickness over a first segment of said bipolar region, said first thickness extending from said extrinsic collector to a substantially planar top surface of said extrinsic base, and said extrinsic base having a second thickness different from said first thickness over a second segment of said bipolar region, said second thickness extending from said dielectric segment to said substantially planar top surface of said extrinsic base;
said collector sinker providing an electrical connection to said intrinsic collector;
forming a nickel layer over said MOS transistor and said bipolar transistor, including on said substantially planar top surface of said extrinsic base in both said first segment and said second segment of said bipolar region, said nickel layer including molybdenum (Mo) additive and/or platinum (Pt) additive;

performing a first rapid thermal anneal to form nickel silicided regions;

removing unreacted nickel of said nickel layer using a first cleaning action; and removing unreacted Mo additive and/or unreacted Pt additive using a second cleaning action.

14. The method of claim 13, wherein said nickel silicided regions comprise a nickel silicided extrinsic base, a nickel silicided emitter, and a nickel silicided collector sinker.

15. The method of claim 13 further comprising performing a second rapid thermal anneal.

16. The method of claim 13, wherein said extrinsic base is raised.

* * * * *